(12) United States Patent
Shin

(10) Patent No.: US 7,456,568 B2
(45) Date of Patent: Nov. 25, 2008

(54) ACTIVE MATRIX TYPE ORGANIC ELECTROLUMINESCENT DEVICE

(75) Inventor: Hyun-Eok Shin, Gunpo-si (KR)

(73) Assignee: Samsung SDI Co., Ltd., Suwon (KR)

( * ) Notice: Subject to any disclaimer, the term of this patent is extended or adjusted under 35 U.S.C. 154(b) by 490 days.

(21) Appl. No.: 11/049,721

(22) Filed: Feb. 4, 2005

(65) Prior Publication Data

US 2005/0174047 A1 Aug. 11, 2005

(30) Foreign Application Priority Data

Feb. 6, 2004 (KR) .................. 10-2004-0007830

(51) Int. Cl.
*H01J 1/62* (2006.01)
(52) U.S. Cl. ............... 313/509; 313/504; 313/506; 313/507
(58) Field of Classification Search ............. 313/505, 313/500, 506, 495–512
See application file for complete search history.

(56) References Cited

U.S. PATENT DOCUMENTS

| 6,674,106 | B2 * | 1/2004 | Tanaka et al. ............ 257/222 |
| 2003/0107326 | A1 * | 6/2003 | Park et al. ............ 315/169.3 |
| 2003/0127652 | A1 * | 7/2003 | Park et al. ............... 257/72 |
| 2003/0141811 | A1 * | 7/2003 | Park et al. .............. 313/506 |
| 2003/0164919 | A1 * | 9/2003 | Oh et al. .................. 349/149 |
| 2003/0201716 | A1 * | 10/2003 | Yamazaki et al. ........ 313/506 |
| 2004/0000864 | A1 * | 1/2004 | Kato .................... 313/504 |
| 2004/0007969 | A1 * | 1/2004 | Lu et al. ................ 313/501 |
| 2004/0012870 | A1 * | 1/2004 | Nishikawa et al. ........ 359/883 |

FOREIGN PATENT DOCUMENTS

| CN | 1278660 | 1/2001 |
| CN | 1413069 | 4/2003 |

OTHER PUBLICATIONS

Thyagaraja et al., Silicon Oxynitride Depositions by LPCVD, Nov. 5, 2002. Presentation, Georgia Tech Microelectronics Research Center.*
Chinese Office Action dated May 9, 2008.

* cited by examiner

*Primary Examiner*—Peter Macchiarolo
(74) *Attorney, Agent, or Firm*—H.C. Park & Associates, PLC

(57) ABSTRACT

An active matrix type organic electroluminescent device includes a plurality of pixels disposed on a substrate. A pixel includes a driving area and a light-emitting area. The light-emitting area comprises a gate insulating layer formed over a substrate, an interlayer insulating layer formed on the gate insulating layer, a first pixel electrode disposed over the interlayer insulating layer and coupled to a driving thin film transistor, a passivation layer interposed between the interlayer insulating layer and the first pixel electrode, a second pixel electrode disposed over the first pixel electrode, and a light-emitting layer interposed between the first pixel electrode and the second pixel electrode. The substrate, the gate insulating layer, the interlayer insulating layer, the first pixel electrode, and the passivation layer each have a refractive index of 1.4 to 1.6.

7 Claims, 7 Drawing Sheets

ACTIVE MATRIX TYPE ORGANIC ELECTROLUMINESCENT DEVICE

CROSS REFERENCE TO RELATED APPLICATION

This application claims priority to and the benefit of Korean Patent Application No. 10-2004-0007830, filed on Feb. 6, 2004, which is hereby incorporated by reference for all purposes as if fully set forth herein.

BACKGROUND OF THE INVENTION

1. Field of the Invention

The present invention relates to an active matrix type organic electroluminescent device, and more particularly, to an active matrix type organic electroluminescent device with enhanced color purity.

2. Discussion of the Background

FIG. 1 is a sectional view showing a pixel of a conventional active matrix type organic electroluminescent device. The pixel includes a thin film transistor 50 disposed in a driving area D and a display unit 60 disposed in a light-emitting area E. The thin film transistor 50 drives the display unit 60. The display unit 60 includes a first pixel electrode 61 coupled to the thin film transistor 50, a second pixel electrode 62 coupled to a power source (not shown), a light-emitting layer 87b interposed between the first and second pixel electrodes 61 and 62, and an electric charge transport layer 87a and/or 87c interposed between the light-emitting layer 87b and at least one of the first and second pixel electrodes 61 and 62.

The first pixel electrode 61 is coupled to a drain electrode of the thin film transistor 50 through a contact hole 85c formed in a passivation layer 85, which protects the thin film transistor 50 during a subsequent fabrication process. The passivation layer 85 may include a SiNx layer 85a and a $SiO_2$ layer 85b, and the $SiO_2$ layer 85b may be disposed on the SiNx layer 85a.

The substrate 81 typically comprises glass and $SiO_2$. Refractive indexes of glass and $SiO_2$ are in the range of about 1.4-1.6, but the refractive index of SiNx is in the range of 1.8-2.0. This difference between refractive indexes may distort light emitted from the light-emitting layer 87b. FIG. 2 shows that, for the conventional organic electroluminescent device of FIG. 1, a plot between intensity and wavelength of emitted light may have a saddle-like form. In this case, the color purity of the organic electroluminescent device decreases.

SUMMARY OF THE INVENTION

The present invention provides an active matrix type organic electroluminescent device having enhanced color purity without additional manufacturing time and costs, as compared to a conventional organic electroluminescent device.

Additional features of the invention will be set forth in the description which follows, and in part will be apparent from the description, or may be learned by practice of the invention.

The present invention discloses an active matrix organic electroluminescent device including a plurality of pixels disposed on a substrate, wherein a pixel comprises a driving area where a first thin film transistor driven by a driving circuit and a second thin film transistor driven by the first thin film transistor are disposed, and a light-emitting area where a display unit driven by the second thin film transistor is disposed. The light emitting area comprises a first pixel electrode disposed over the substrate and coupled to the second thin film transistor, a passivation layer interposed between the substrate and the first pixel electrode, a second pixel electrode disposed over the first pixel electrode, and a light-emitting layer interposed between the first pixel electrode and the second pixel electrode. The first pixel electrode and each layer disposed below the first pixel electrode in the light emitting area has a refractive index in a range of 1.4 to 1.6.

The present invention also discloses an active matrix type organic electroluminescent device including a plurality of pixels disposed on a substrate, wherein a pixel comprises a driving area where a first thin film transistor driven by a driving circuit and a second thin film transistor driven by the first thin film transistor are disposed, and a light-emitting area where a display unit driven by the second thin film transistor is disposed. The light emitting area comprises a first pixel electrode contacting an upper surface of an interlayer insulating layer and coupled to the second thin film transistor, a second pixel electrode disposed over the first pixel electrode, and a light-emitting layer interposed between the first pixel electrode and the second pixel electrode. The first pixel electrode and each layer disposed below the first pixel electrode in the light emitting area has a refractive index in a range of 1.4 to 1.6.

The present invention also discloses an active matrix type organic electroluminescent device comprising a plurality of pixels disposed on a substrate. A pixel comprises a driving area where a first thin film transistor driven by a driving circuit and a second thin film transistor driven by the first thin film transistor are disposed, a light-emitting area where a display unit driven by the second thin film transistor is disposed, and a first passivation layer covering the first thin film transistor and the second thin film transistor. The light emitting area comprises a gate insulating layer formed over the substrate, an interlayer insulating layer formed on the gate insulating layer, a first pixel electrode disposed over the interlayer insulating layer and coupled to the second thin film transistor, a second passivation layer interposed between the interlayer insulating layer and the first pixel electrode, a second pixel electrode disposed over the first pixel electrode, and a light-emitting layer interposed between the first pixel electrode and the second pixel electrode. The substrate, the gate insulating layer, the interlayer insulating layer, the first pixel electrode, and the second passivation layer each have a refractive index in a range of 1.4 to 1.6.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 3:
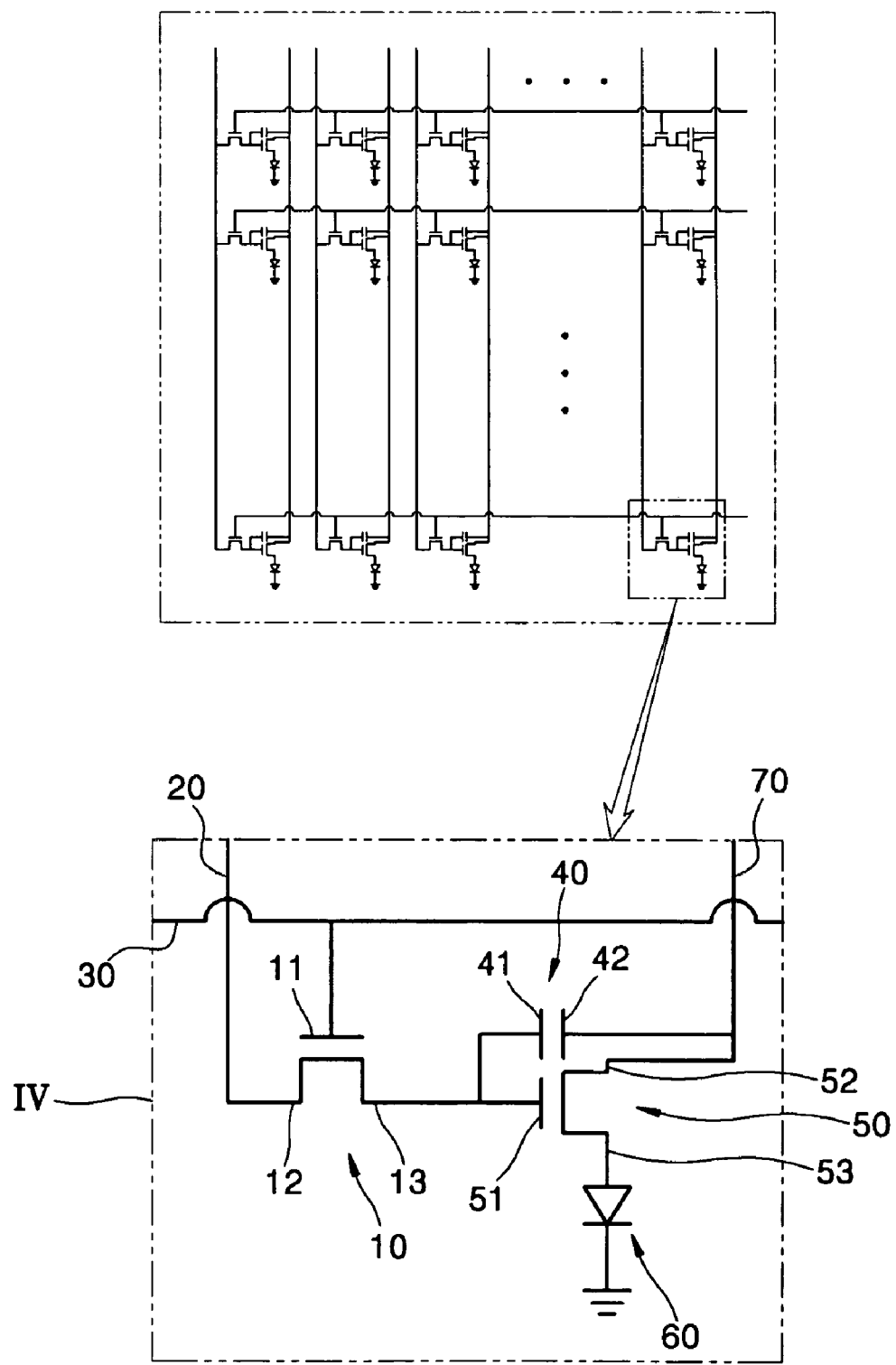
FIG. 3 is a circuit diagram showing a circuit of an active matrix type organic electroluminescent device and an enlarged view of a circuit (IV) according to a first exemplary embodiment of the present invention.
Figure 4:
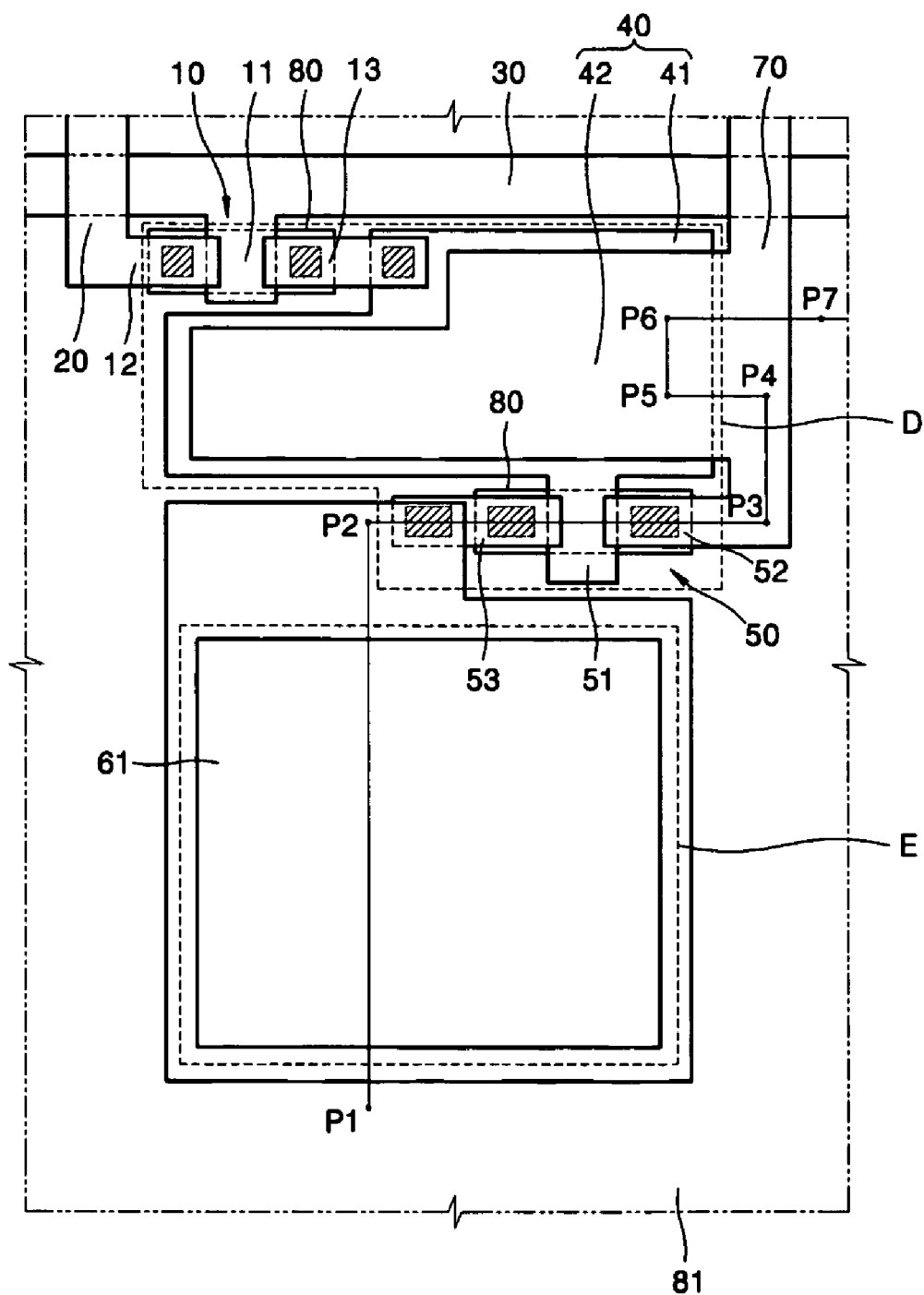
FIG. 4 is a schematic diagram showing a structure of the circuit (IV) shown in FIG. 3.
Figure 5:
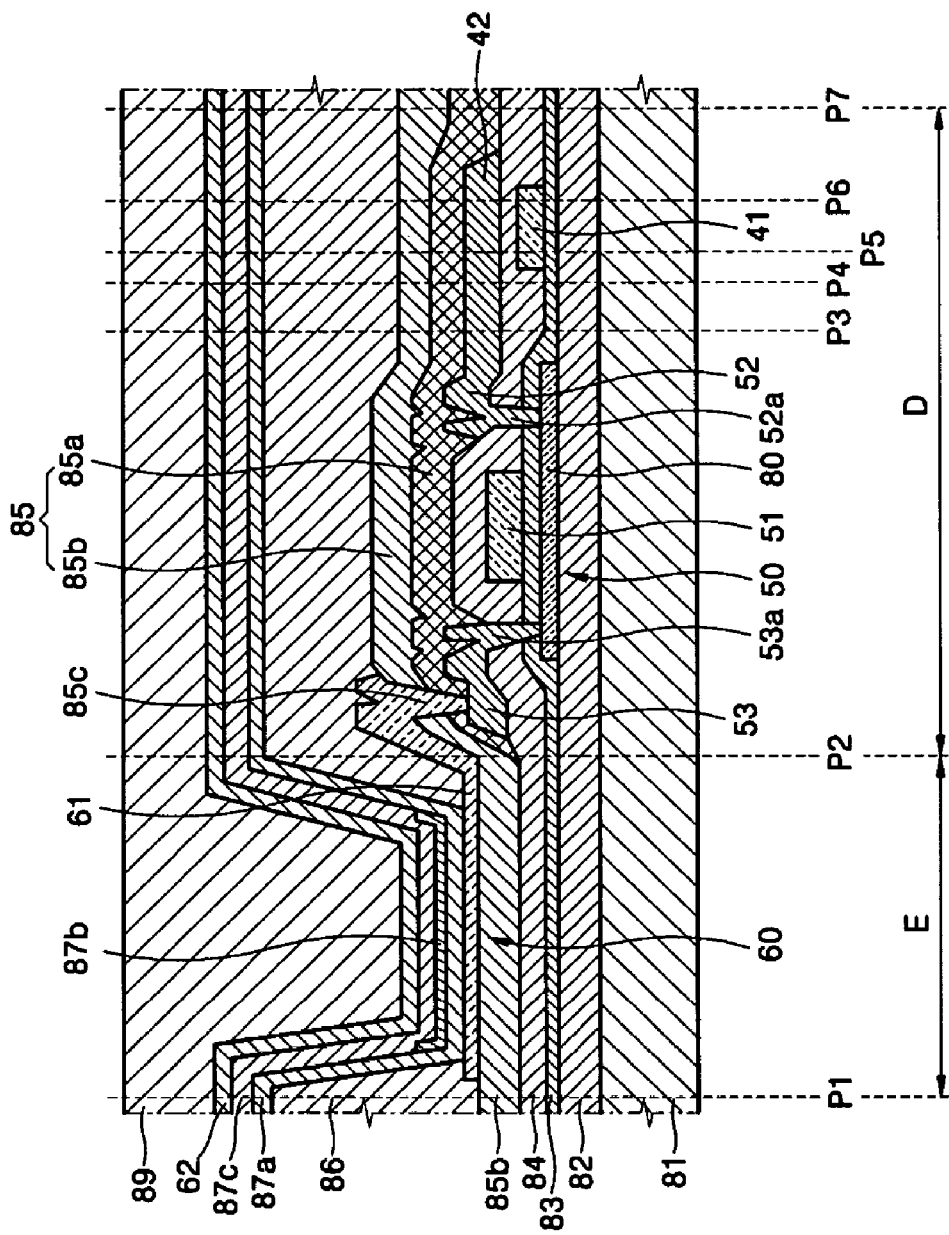
FIG. 5 is a sectional view along line $P_1$-$P_7$ in FIG. 4.

An organic electroluminescent device according to a first exemplary embodiment of the present invention will now be described with reference to FIG. 3, FIG. 4 and FIG. 5. FIG. 3 shows a circuit including a plurality of pixels formed on a substrate of an organic electroluminescent device and an enlarged view of a circuit (IV) of a pixel. A pixel may include a first thin film transistor 10 driven by a driving circuit (not shown), a second thin film transistor 50 driven by the first thin film transistor 10, and a display unit 60 driven by the second thin film transistor 50. The display unit 60 emits red, green, or blue light, depending upon the material its light emitting layer comprises. FIG. 4 is a schematic diagram showing a physical structure of the circuit (IV) shown in FIG. 3, and FIG. 5 is a sectional view along line $P_1$-$P_7$ in FIG. 4. For ease of description, FIG. 4 does not show all elements of FIG. 5, and in FIG. 4, hatched areas contain overlapped elements that may be coupled to each other, while other elements may be insulated by the gate insulating layer 83, the interlayer insulating layer 84, the passivation layer 85, and the like.

Referring to FIG. 3, FIG. 4 and FIG. 5, a second conductive line 30 couples a first gate electrode 11 of the first thin film transistor 10 to the driving circuit, and a first conductive line 20 couples a first source electrode 12 of the first thin film transistor 10 to the driving circuit. A first drain electrode 13 of the first thin film transistor 10 is coupled to a lower electrode 41 of a storage capacitor 40 and to a gate electrode 51 of the second thin film transistor 50. A third conductive line 70 couples a source electrode 52 of the second thin film transistor 50 and an upper electrode 42 of the storage capacitor 40 to the driving circuit. A drain electrode 53 of the second thin film transistor 50 may be coupled to an anode of the display unit 60 (e.g. a first pixel electrode 61 of FIG. 5), and a cathode of the display unit 60 (e.g. a second pixel electrode 62 of FIG. 5) may be coupled to a power source either through the driving circuit or directly. In this exemplary embodiment, the first conductive line 20 may be a data line, and the second conductive line 30 may be a scan line.

When the driving circuit (not shown) provides a voltage to the first gate electrode 11, a conductive channel may be formed in a semiconductor layer 80, which couples the first source electrode 12 and the first drain electrode 13 to each other. The first conductive line 20 provides electric charges to the first source electrode 12 that flow to the first drain electrode 13. The driving circuit may also provide electric charges to the third conductive line 70. Generally, the amount of electric charges determines the intensity of light emitted from the light-emitting layer 87b. When the first drain electrode 13 applies a voltage to the second gate electrode 51, electric charges of the second source electrode 52 may flow through the second drain electrode 53 to the first pixel electrode 61. The term "driving circuit" includes driving circuits that are coupled to the first conductive line 20, the second conductive line 30, and the third conductive line 70.

The electric charges (e.g. holes) that flow to the first pixel electrode 61 move to the light-emitting layer 87b, where they may recombine with other electric charges (e.g. electrons) that flow through the second pixel electrode 62. Recombined holes and electrons may form exitons, and the exitons transform from an excited state to a ground state. Thus, the light-emitting layer 87b emits light.

Referring to FIG. 5, a structure of a pixel will now be described in detail. The display unit 60 is disposed in a light-emitting area E, which is defined between points $P_1$ and $P_2$. Points $P_2$ to $P_7$ define a driving area D, in which the second thin film transistor 50 is disposed between points $P_2$ and $P_3$, and the storage capacitor 40 is disposed between points $P_3$ and $P_7$.

A buffer layer 82 may be formed on a substrate 81. A semiconductor layer 80, which may be made of a semiconductor material such as silicon, is formed on a portion of the buffer layer 82 in the driving area D, and a gate-insulating layer 83 is formed to cover the buffer layer 82 and the semiconductor layer 80. The first and second gate electrodes 11 and 51, and the lower electrode 41 of the storage capacitor 40, are formed on the gate insulating layer 83, and an interlayer insulating layer 84 is formed to cover at least the first and second gate electrodes 11 and 51 and the lower electrode 41. All forming operations may take place in a single process, so that the above-mentioned elements may be found in each pixel.

Via holes 53a and 52a may be formed in portions of the gate insulating layer 83 and the interlayer insulating layer 84 that are adjacent to the second gate electrode 51. Via holes may also be formed in portions of the gate insulating layer 83 and the interlayer insulating layer 84 that are adjacent to the first gate electrode 11. Source electrodes 12 and 52 and drain electrodes 13 and 53 may be formed in areas including the areas where these via holes are formed. Next, a passivation layer 85 is formed to cover at least the driving area D. The passivation layer's structure will be described below.

The first thin film transistor 10 comprises the semiconductor layer 80, the gate insulating layer 83, the first gate electrode 11, the interlayer insulating layer 84, the first source electrode 12, and the first drain electrode 13. The second thin film transistor 50 comprises the semiconductor layer 80, the gate insulating layer 83, the second gate electrode 51, the interlayer insulating layer 84, the second source electrode 52, and the second drain electrode 53. The first and second thin film transistors 10 and 20 may have similar cross-sectional structures.

The passivation layer 85 covers the first thin film transistor 10 and the second thin film transistor 50. The first pixel electrode 61 is coupled to the drain electrode 53 through the contact hole 85c formed in the passivation layer 85.

Generally, thin film transistors may be divided into staggered types, inverted staggered types, coplanar types, and inverted coplanar types. In this exemplary embodiment, the first thin film transistor 10 and the second thin film transistor 50 are shown as coplanar types, but the invention is not limited thereto.

Referring to FIG. 5, the passivation layer 85 comprising a SiNx layer 85a and a $SiO_2$ layer 85b is disposed in the driving area D. In FIG. 5, the $SiO_2$ layer 85b is disposed on the SiNx layer 85a in the driving area D. However, the SiNx layer 85a may be disposed on the $SiO_2$ layer 85b. Additionally, the passivation layer 85 in the driving area D may include the $SiO_2$ layer 85b only.

As FIG. 5 shows, the display unit 60 is disposed in the light-emitting area E. The display unit 60 includes: the first pixel electrode 61, which may be coupled to the second drain electrode 53, the second pixel electrode 62, which faces the first pixel electrode 61, and the light-emitting layer 87b, which is interposed between the first and second pixel electrodes 61 and 62. The first electric charge transport layer 87a may be interposed between the light-emitting layer 87b and the first pixel electrode 61, and the second electric charge transport layer 87c may be interposed between the light-emitting layer 87b and the second pixel electrode 62. However, the first electric charge transport layer 87a and/or the second electric charge transport layer 87c may be omitted.

The light-emitting layer 87b may be made of a low weight molecular material or a polymer organic material. Examples of the low weight molecular organic material include phthalocyanine, such as copper phthalocyanine (CuPc), N,N'-di(naphthalene-1-yl)-N,N'-diphenyl-benzidine (NPB), tris-8-hydroxyquinoline aluminium (Alq3), and other like substances. Examples of the polymer organic material include poly-phenylenevinylenes (PPV), polyfluorenes, and other like substances.

The light-emitting layer 87b may include a different compound according to the color of light to be emitted. For example, to emit red light, the light-emitting layer 87b may include poly(1,4-phenylenevinylene) derivative, nile red, 4-dicyanomethylene-2-methyl-6-(julolidine-4-yl-vinyl)-4H-pyran (DCM2), 2,3,7,8,12,13,17,18-oxtaethyl, 21H, 23H-porphine platinum(II)(PEOEP), 4-(dicyanomethylene)-2-tertbutyl-6-(1,1,7,7-tetramethyljulolidyl-9-enyl)-4H-pyran, or other like substances. To emit green light, the light-emitting layer 87b may include 10-(2-benzothiazolyl)-2,3,6,7-tetrahydro-1,1,7,7-tetramethyl-1H,5H,11H-[1]benzopyrano[6,7,8-ij]quinolizine(C545T), tri(8-hydroxyquinolato)aluminium(Alq3), tris(2-(2-pyridylphenyl-C,N))iridium(II)(Ir)ppy, or other like substances. And to emit blue light, the light emitting layer 87b may include fluorene polymers, spirofluorene polymers, carbazol-based low weight molecule such as dicarbazolstylbene (DCS)(also called as "bis[carbazole-(9)]-stylbene"), 4,4'-bis(2,2'-diphenylethen-1-yl)biphenyl(DPBVi), N,N'-bis(naphthalene-1-yl)-N,N'-bis(phenyl)benzidine(α-NPD), or other like substances.

The first electric charge transport layer 87a and the second electric charge transport layer 87c may include an electric charge injection layer and/or an electric charge transfer layer. The electric charge injection layer is made of a material that allows smooth injection of electric charges, and the electric charge transfer layer delivers electric charges smoothly. The electric charge injection layer may be an electron injection layer (EIL) and a hole injection layer (HIL), and the electric charge transfer layer may be an electron transfer layer (ETL) and a hole transfer layer (HTL).

If the first pixel electrode 61 is an anode and the second pixel electrode 62 is a cathode, the first electric charge transport layer 87a may be an HTL, and the second electric charge transport layer 87c may be an ETL. The first electric charge transport layer 87a may include an HIL and an HTL. The HIL may be made of CuPc or starburst type amines such as TCTA, m-MTDATA, m-MTDAPB, or other like substances. The HTL may be made of N,N'-bis(3-methylphenyl)-N,N'-diphenyl-[1,1-biphenyl]-4,4'-diamine(TPD), N,N'-di(naphthalene-1-yl)-N,N'-diphenyl-benxidine (α-NPD), or other like substances. The second electric charge transport layer 87c may include an EIL and an ETL. The EIL may be made of LiF, NaCl, CsF, Li₂O, BaO, or other like substances. The ETL may be made of A-oxazoles, iso-oxazoles, triazoles, isothiazoles, oxidiazoles, thiadiazoles, perylenes, aluminium complexes (e.g., Alq3(tris(8-quinolinolato)-aluminium), BAlq, SAlq, Almq3), gallium complexes (e.g., Gaq'2OPiv, Gaq'2OAc, 2(Gaq'2)), or other like substances.

Figure 6:
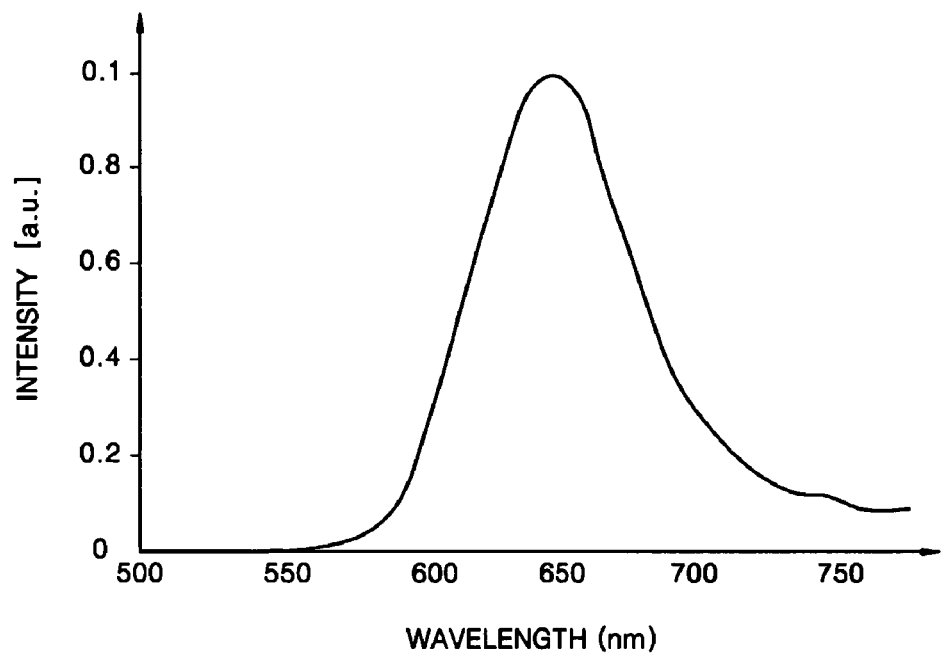
FIG. 6 is a plot of the intensity of light versus the wavelength of light emitted from a light-emitting area E of FIG. 5.

The substrate 81, the buffer layer 82, the gate insulating layer 83, the interlayer insulating layer 84, and the SiO₂ layer 85b may be sequentially disposed below the display unit 60. Since the SiNx layer 85a, which has the refractive index of 1.8 to 2.0, is not formed in the light-emitting area E of the organic electroluminescent device according to the present exemplary embodiment, light emitted from the light-emitting layer 87b may not be noticeably diffracted. As a result, as shown in FIG. 6, the plot of intensity of light versus wavelength of light emitted from the organic electroluminescent device may be a Gaussian curve. In other words, color purity of the organic electroluminescent device may not deteriorate, and it may be enhanced as compared to a conventional organic electroluminescent device. The first electric charge transport layer 87a, the second electric charge transport layer 87c, the first pixel electrode 61, the SiO₂ layer 85b, the interlayer insulating layer 84, the gate insulating layer 83, the buffer layer 82, and the substrate 81 of the light-emitting area E have a refractive index in the range of 1.4 to 1.6. Since there is little difference between the refractive indexes of the above-mentioned elements, light emitted from the light-emitting layer 87b may not be noticeably diffracted.

The present invention may be useful for bottom emission type and both-direction emission type organic electroluminescent devices. Light emitted from the light-emitting layer 87b of a bottom emission type organic electroluminescent device may be reflected by the second pixel electrode 62, which may be made of a light-reflecting conductive material, and then emitted toward a lower side of the substrate 81 through the first pixel electrode 61, which may be made of a light-transmitting conductive material. Light emitted from a both-direction organic electroluminescent device is discharged in two directions (upward and downward directions in FIG. 5) through the first pixel electrode 61 and the second pixel electrode 62, which may be made of a light-transmitting conductive material. Examples of the light-reflecting conductive material include Al, Ag, and other like substances. Indium tin oxide is an example of the light-transmitting conductive material.

A planarizing layer 86, which planarizes the first electric charge transport layer 87a, the second electric charge transport layer 87c, and the second pixel electrode 62, may be formed on the passivation layer 85. Additionally, a protecting layer 89 may be formed on the second pixel electrode 62. However, the planarizing layer 86 and the protecting layer 89 may be omitted.

The storage capacitor 40 includes the lower electrode 41 and the upper electrode 42. The lower electrode 41 and the second gate electrode 51 may be formed in a single, integrated body, and the upper electrode 42 and the second source electrode 52 may also be formed in a single, integrated body. The storage capacitor 40 may maintain a luminescence of the first pixel electrode 61 for a predetermined period of time, or increase a driving speed.

Figure 7:
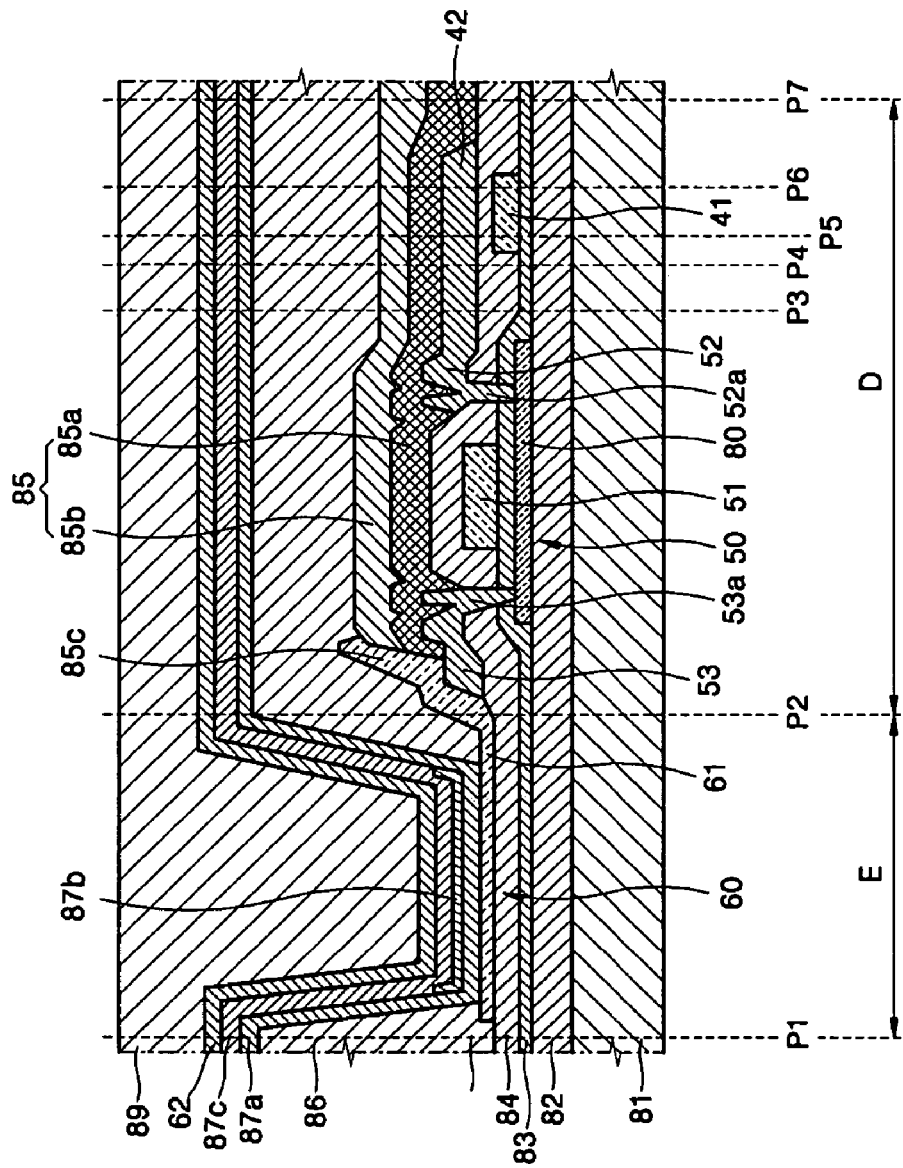
FIG. 7 is a sectional view illustrating a pixel of an active matrix organic electroluminescent device according to a second exemplary embodiment of the present invention.

Hereinafter, an organic electroluminescent device according to a second exemplary embodiment will now be described with reference to FIG. 7. The second exemplary embodiment differs from the first embodiment in that the SiO₂ layer 85b is not interposed between the interlayer insulating layer 84 and the first pixel electrode 61. Since the SiO₂ layer 85b serves to protect the first and second thin film transistors 10 and 20, it may not need to be formed in the light-emitting area E. However, either one or both of these layers may be disposed in the driving area D.

Similar to the first embodiment, the SiNx layer 85a, which has the refractive index of 1.8 to 2.0, is not disposed in the light emitting area E. Accordingly, as shown in FIG. 6, light emitted from the light-emitting layer 87b may not be noticeably diffracted. Hence, the plot of the intensity of the light versus the wavelength of light emitted from the organic electroluminescent device may be a Gussian curve. In other words, color purity of the organic electroluminescent device may not deteriorate, and it may be enhanced as compared to a conventional organic electroluminescent device. The first electric charge transport layer 87a, the second electric charge transport layer 87c, the first pixel electrode 61, the interlayer insulating layer 84, the gate insulating layer 83, the buffer layer 82, and the substrate 81 in the light-emitting area E have a refractive index in the range of 1.4 to 1.6. Since there is little difference between the refractive indexes of the above-mentioned elements, the light emitted from the light-emitting layer 87b may not be noticeably diffracted.

Additionally, in the second exemplary embodiment, only one mask may be required to form the SiNx layer 85a and the SiO$_2$ layer 85b since they are not formed in the light-emitting area E.

Figure 1:
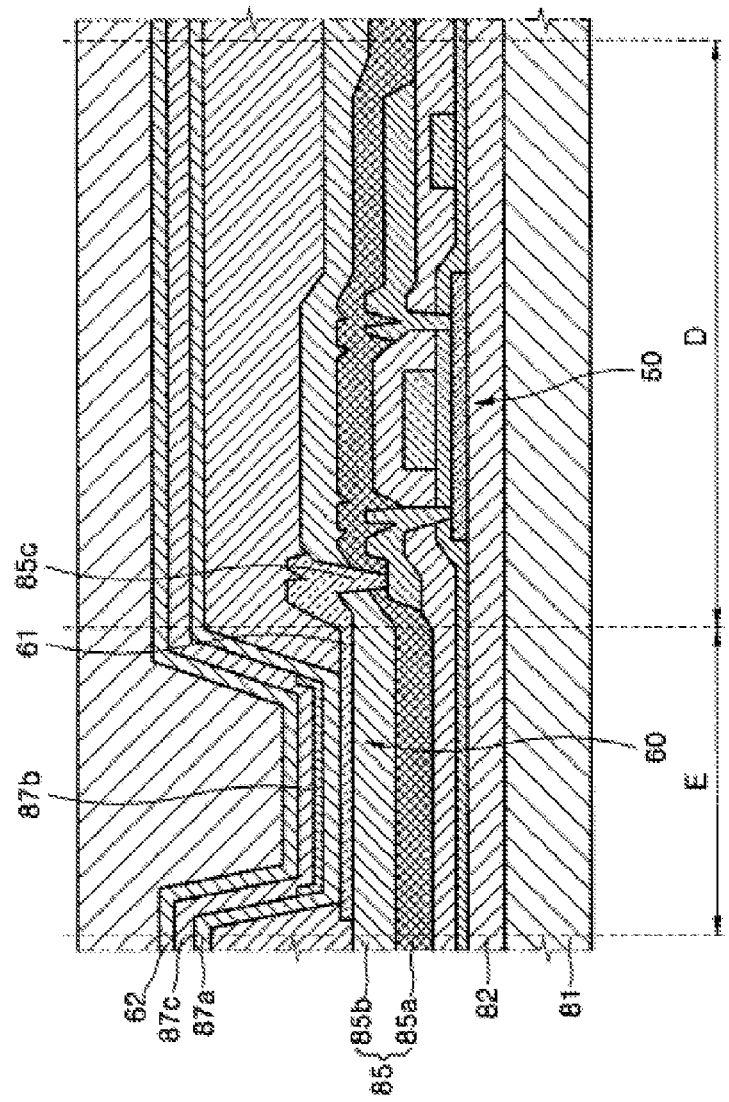
FIG. 1 is a sectional view showing a pixel of a conventional active matrix type organic electroluminescent device.
Figure 2:
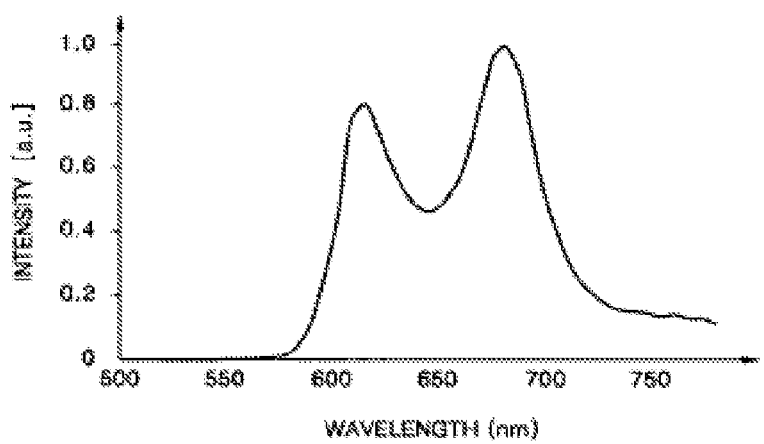
FIG. 2 is a plot of the intensity of light versus the wavelength of light emitted from a light-emitting area E of FIG. 1.

In fact, when forming the contact hole 85c of the conventional organic electroluminescent device of FIG. 1, at least one mask is required. Therefore, the manufacturing process of an organic electroluminescent device of the present invention may not require additional manufacturing time and costs.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An active matrix type organic electroluminescent device, comprising:
    a plurality of pixels disposed on a substrate;
    a first passivation layer disposed in the pixels and being made of SiO$_2$; and
    a second passivation layer disposed in the pixels and being made of SiNx;
    wherein a pixel comprises:
        a driving area where a first thin film transistor driven by a driving circuit and a second thin film transistor driven by the first thin film transistor are disposed; and
        a light-emitting area where a display unit driven by the second thin film transistor is disposed,
    wherein the light emitting area comprises:
        a first pixel electrode disposed over the substrate and coupled to the second thin film transistor;
        a second pixel electrode disposed over the first pixel electrode; and
        a light-emitting layer interposed between the first pixel electrode and the second pixel electrode,
    wherein at least a portion of the second passivation layer corresponding to the light emitting area is patterned to be eliminated so that the first pixel electrode and each layer disposed below the first pixel electrode in the light emitting area has a refractive index in a range of 1.4 to 1.6, and
    wherein the first passivation layer covers the second passivation layer and the first pixel electrode is formed on the first passivation layer.

2. The active matrix type organic electroluminescent device of claim 1,
    wherein the first pixel electrode is made of a transparent conductive material; and
    wherein the second pixel electrode is made of a light-reflecting conductive material.

3. The active matrix type organic electroluminescent device of claim 1,
    wherein a portion of the second passivation layer corresponding to the driving area covers the first thin film transistor and the second thin film transistor; and
    wherein the first pixel electrode is coupled to a drain electrode of the second thin film transistor through a contact hole formed in the second passivation layer.

4. The active matrix type organic electroluminescent device of claim 3, further comprising a planarizing layer formed on the second passivation layer.

5. The active matrix type organic electroluminescent device of claim 1, further comprising a capacitor disposed in the driving area.

6. The active matrix type organic electroluminescent device of claim 1, further comprising:
    a gate insulating layer formed over the substrate in the light emitting area;
    an interlayer insulating layer formed on the gate insulating layer; and
    a buffer layer interposed between the substrate and the gate insulating layer in both the light-emitting area and the driving area.

7. The active matrix type organic electroluminescent device of claim 1,
    wherein a gate electrode and a source electrode of the first thin film transistor, and a source electrode of the second thin film transistor, are coupled to the driving circuit;
    wherein a drain electrode of the first thin film transistor is coupled to a gate electrode of the second thin film transistor; and
    wherein the second pixel electrode is coupled to a power source.

* * * * *